US010338703B2

United States Patent
Suh

(10) Patent No.: US 10,338,703 B2
(45) Date of Patent: Jul. 2, 2019

(54) TOUCH PAD FOR ELECTRONIC DEVICE

(71) Applicant: Samsung Electronics Co., Ltd., Gyeonggi-do (KR)

(72) Inventor: Young-Hoon Suh, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 59 days.

(21) Appl. No.: 15/471,672

(22) Filed: Mar. 28, 2017

(65) Prior Publication Data

US 2017/0285776 A1    Oct. 5, 2017

(30) Foreign Application Priority Data

Mar. 29, 2016    (KR) .................. 10-2016-0037902

(51) Int. Cl.
| | |
|---|---|
| *G06F 3/0354* | (2013.01) |
| *H01Q 1/24* | (2006.01) |
| *H01Q 1/38* | (2006.01) |
| *H03K 17/96* | (2006.01) |

(52) U.S. Cl.
CPC ......... *G06F 3/03547* (2013.01); *H01Q 1/242* (2013.01); *H01Q 1/38* (2013.01); *H03K 17/96* (2013.01); *H03K 17/962* (2013.01); *H03K 2017/9602* (2013.01); *H03K 2217/96015* (2013.01); *H03K 2217/96031* (2013.01)

(58) Field of Classification Search
CPC ...... G06F 3/03547; H01Q 1/242; H01Q 1/38; H03K 17/96; H03K 17/962
See application file for complete search history.

(56) References Cited

U.S. PATENT DOCUMENTS

| | | | | |
|---|---|---|---|---|
| 2006/0274050 A1* | 12/2006 | Lii | ......................... | G06F 3/0202 345/173 |
| 2013/0271942 A1* | 10/2013 | Kim | ...................... | H05K 1/0218 361/816 |
| 2014/0340348 A1* | 11/2014 | Park | ......................... | G06F 3/044 345/174 |
| 2015/0331513 A1 | 11/2015 | Lee | | |

FOREIGN PATENT DOCUMENTS

KR    1020150130884    11/2015

* cited by examiner

*Primary Examiner* — Lisa S Landis
(74) *Attorney, Agent, or Firm* — The Farrell Law Firm, P.C.

(57) ABSTRACT

A touch pad for an electronic device is provided. The touch pad includes a circuit board member; and a detection member mounted in at least one area of the circuit board member to detect a user's contact, wherein the detection member includes a plurality of film layers; and detection patterns disposed on at least two adjacent film layers, among the plurality of film layers, so as to be misaligned with each other, wherein the detection patterns at least partially overlap each other.

10 Claims, 13 Drawing Sheets

TOUCH PAD FOR ELECTRONIC DEVICE

PRIORITY

This application claims priority under 35 U.S.C. § 119(a) to Korean patent application Ser. No. 10-2016-0037902, which was filed in the Korean Intellectual Property Office on Mar. 29, 2016, the entire content of which is incorporated herein by reference.

BACKGROUND

1. Field of the Disclosure

The present disclosure generally relates to an electronic device, and more particularly, to a touch pad for an electronic device that can minimize interference between an antenna device and the touch pad.

2. Description of the Related Art

Electronic devices have been provided to enable users to execute various functions. With the enhancement of multimedia functions using portable electronic devices, the electronic devices have been equipped with large display devices, and with the common use of high-capacity and high-speed wireless communication, various functions have been integrated into one electronic device, for example, one mobile communication terminal.

In addition, considering portability, compactness and weight reduction of electronic devices have been indispensably required. Physical keypads have been removed from electronic devices on account of touch screen functions of display devices. As a result, electronic devices have become smaller and slimmer. However, as electronic devices are equipped with large display devices for multimedia functions, such as reproduction of videos, etc., compactness and weight reduction of portable terminals are inevitably focused on a reduction in the thickness thereof.

However, there is a difficulty in ensuring the installation space of an antenna device while making an electronic device compact and light. For example, an antenna device is generally installed on other circuit components in a stack structure. In this case, the antenna device has to be separated from the other circuit components by a sufficient distance in order to maintain the radiation characteristic of the antenna device. However, there is a limitation in mounting the antenna device with a sufficient distance from the other circuit components due to the nature of a portable electronic device. In addition, it is not easy to ensure a separate space that does not overlap the other circuit components in the electronic device having modules mounted thereon for various functions.

Accordingly, the antenna device and the circuit components are disposed close to each other in a stack structure. In this case, the radiation power of the antenna device or the performance of the circuit components (for example, a touch pad) has to be regulated in order to prevent a radiation signal of the antenna device from being blocked or distorted. However, this leads to a degradation in the performance of the antenna device or the circuit components.

SUMMARY

Accordingly, an aspect of the present disclosure is to provide a touch pad for an electronic device that can maintain the radiation performance of an antenna device in an optimal state while maintaining the performance of internal circuit components in an optimal state even though the touch pad and the antenna device are mounted to overlap each other.

In accordance with an aspect of the present disclosure, a touch pad for an electronic device is provided, which includes a circuit board member and a detection member mounted in at least one area of the circuit board member to detect a user's contact, in which the detection member includes a plurality of film layers; and detection patterns disposed on at least two adjacent film layers, among the plurality of film layers, wherein the detection patterns at least partially overlap each other.

In accordance with an aspect of the present disclosure, an electronic device is provided which includes a circuit board member disposed in at least one area of a main body of the electronic device; a detection member mounted in at least one area of the circuit board member to detect a user's contact; and an antenna feeding part that shares a mounting area of the detection member and is mounted in at least one area of the circuit board member in which the detection member includes a substrate mounted in the mounting area and having a plurality of films stacked one above another; and detection patterns disposed on two adjacently stacked films of the substrate, wherein the detection patterns at least partially overlap each other.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION

Figure 1:
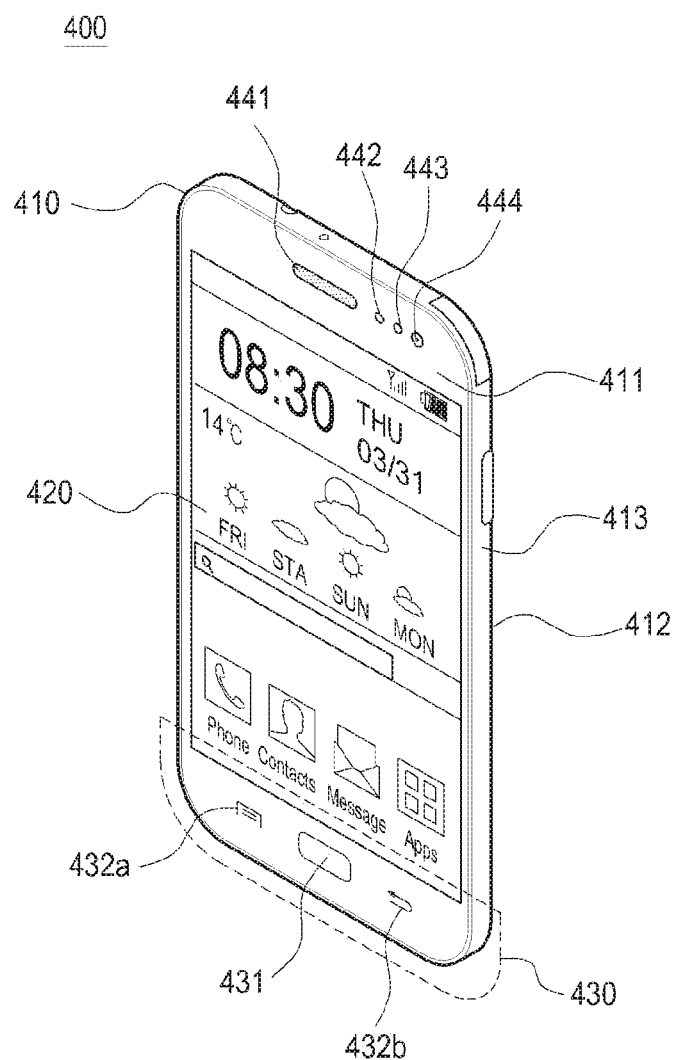
FIG. 1 illustrates a perspective view of an electronic device according to an embodiment of the present disclosure.

Hereinafter, various embodiments of the present disclosure will be described with reference to the accompanying drawings. However, it should be understood that there is no intent to limit the present disclosure to the particular forms disclosed herein; rather, the present disclosure should be construed to cover various modifications, equivalents, and/or alternatives of embodiments of the present disclosure. In describing the drawings, similar reference numerals may be used to designate similar constituent elements.

As used herein, the expressions "have", "may have", "include", or "may include" refer to the existence of a corresponding feature (e.g., numeral, function, operation, or constituent element such as component), and do not exclude one or more additional features.

In the present disclosure, the expressions "A or B", "at least one of A or/and B", or "one or more of A or/and B" may include all possible combinations of the items listed. For example, the expressions "A or B", "at least one of A and B", or "at least one of A or B" refer to all of (1) including at least one A, (2) including at least one B, or (3) including all of at least one A and at least one B.

The expressions "a first", "a second", "the first", or "the second" used in various embodiments of the present disclosure may modify various components regardless of the order and/or the importance but do not limit the corresponding components. For example, a first user device and a second user device indicate different user devices although both of them are user devices. For example, a first element may be referred to as a second element, and similarly, a second element may be referred to as a first element without departing from the scope of the present disclosure.

It should be understood that when an element (e.g., first element) is referred to as being (operatively or communicatively) "connected," or "coupled," to another element (e.g., second element), it may be directly connected or coupled directly to the other element or any other element (e.g., third element) may be interposer between them. In contrast, it may be understood that when an element (e.g., first element) is referred to as being "directly connected," or "directly coupled" to another element (second element), there are no element (e.g., third element) interposed between them.

The expression "configured to" used in the present disclosure may be used interchangeably with, for example, "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may mean that the device, together with other devices or components, "is able to". For example, the phrase "processor adapted (or configured) to perform A, B, and C" may mean a dedicated processor (e.g., embedded processor) only for performing the corresponding operations or a generic-purpose processor (e.g., central processing unit (CPU) or application processor (AP)) that can perform the corresponding operations by executing one or more software programs stored in a memory device.

The terms used herein are merely for the purpose of describing particular embodiments and are not intended to limit the scope of other embodiments. A singular expression may include a plural expression unless they are definitely different in a context. Unless defined otherwise, all terms used herein, including technical and scientific terms, have the same meaning as those commonly understood by a person skilled in the art to which the present disclosure pertains. Such terms as those defined in a generally used dictionary may be interpreted to have the same meanings as the contextual meanings in the relevant field of art, and are not to be interpreted to have ideal or excessively formal meanings unless clearly defined in the present disclosure. In some cases, even terms defined in the present disclosure should not be interpreted to exclude embodiments of the present disclosure.

An electronic device according to various embodiments of the present disclosure may include at least one of, for example, a smart phone, a tablet Personal Computer (PC), a mobile phone, a video phone, an electronic book reader (e-book reader), a desktop PC, a laptop PC, a netbook computer, a workstation, a server, a Personal Digital Assistant (PDA), a Portable Multimedia Player (PMP), a MPEG-1 audio layer-3 (MP3) player, a mobile medical device, a camera, and a wearable device. According to various embodiments, the wearable device may include at least one of an accessory type (e.g., a watch, a ring, a bracelet, an anklet, a necklace, a glasses, a contact lens, or a Head-Mounted Device (HMD)), a fabric or clothing integrated type (e.g., an electronic clothing), a body-mounted type (e.g., a skin pad, or tattoo), and a bio-implantable type (e.g., an implantable circuit).

According to some embodiments, the electronic device may be a home appliance. The home appliance may include at least one of, for example, a television, a Digital Video Disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

According to another embodiment, the electronic device may include at least one of various medical devices (e.g., various portable medical measuring devices (a blood glucose monitoring device, a heart rate monitoring device, a blood pressure measuring device, a body temperature measuring device, etc.), a Magnetic Resonance Angiography (MRA), a Magnetic Resonance Imaging (MRI), a Computed Tomography (CT) machine, and an ultrasonic machine), a navigation device, a Global Positioning System (GPS) receiver, an Event Data Recorder (EDR), a Flight Data Recorder (FDR), a Vehicle Infotainment Devices, an electronic devices for a ship (e.g., a navigation device for a ship, and a gyro-compass), avionics, security devices, an automotive head unit, a robot for home or industry, an automatic teller machine (ATM) in banks, point of sales (POS) terminal in a shop, or an Internet of things (IoT) device (e.g., a light bulb, various sensors, electric or gas meter, a sprinkler device, a fire alarm, a thermostat, a streetlamp, a toaster, sporting goods, a hot water tank, a heater, a boiler, etc.).

According to some embodiments, the electronic device may include at least one of a part of furniture or a building/structure, an electronic board, an electronic signature receiving device, a projector, and various kinds of measuring instruments (e.g., a water meter, an electric meter, a gas meter, and a radio wave meter). The electronic device may be a combination of one or more of the aforementioned various devices. The electronic device may also be a flexible device. Further, the electronic device is not limited to the aforementioned devices, and may include a new electronic device according to the development of new technology.

FIG. 1 is a schematic view of an electronic device 400 according to an embodiment of the present disclosure.

Referring to FIG. 1, the electronic device 400 may include a housing 410 and a display device the display 420 that may output a screen to at least one surface of the housing 410 and may implement an input according to contact or proximity of a touch.

The housing 410 may include a first surface 411, a second surface 412, and side surfaces 413.

The first surface 411 of the housing 410 may be directed in a first direction, and the second surface 412 of the housing 410 may be directed in a second direction that is opposite to the first direction. The side surfaces 413 of the housing 410 may be provided to surround at least a part of the space between the first surface 411 and the second surface 412.

The display 420 that displays a screen may be provided on at least one of the first and second surfaces 411 and 412 of the housing 410 and a battery that supplies power to the electronic device 400 and a rear case that covers the battery may be provided on the opposite surface of the housing 410. The first surface 411 of the electronic device 400 may be the front surface on which the display 420 is mounted, and the second surface 412 of the electronic device 400 may be the rear surface on which the battery is mounted.

The display 420 may implement an input according to contact or proximity of an object and may display an image according to a user environment. The display 420 may be disposed on at least one surface of the housing 410 (hereinafter, the display 420 will be understood to be disposed on the first surface 411), and may include a touch panel and a display panel stacked thereon, which displays a screen to one surface of the touch panel.

The display 420 may display an input and an output according to the input through an object (such as a hand) that has an electrical charge or a module (such as a digitizer pen or a stylus pen). The display 420, according to an embodiment of the present disclosure, may receive an input of continuous movement of at least one contact. The term "contact" may include non-contact, for example, proximity without being limited to direct contact of a user's body or the module (such as a stylus pen) with the display 420 or a separate input device that implements an input of a touch type. Furthermore, the interval that can be detected by the display unit 420 may vary depending on the performance or structure of the electronic device 400.

A receiver, ambient light sensors 442 and 443, and a front camera 444 may be disposed on the upper side of the display 420. In addition, an independent keypad 430 may be provided on the lower side of the display 420 on the front surface of the electronic device 400. The keypad 430 may be constituted by a home key 431, a menu key 432a, and a back key 432b that are frequently used to operate the electronic device 400.

A camera module may be mounted on the second surface 412 of the housing 410 that is opposite to the first surface on which the display 420 is disposed, and may be used by a user to take photographs of a subject.

In addition, at least one antenna may be embedded in the electronic device 400 and may enable the electronic device 400 to perform a mobile communication function. In the arrangement of the antenna device in the electronic device 400, the antenna device may be installed in an outer area within the housing 410, particularly, on the upper or lower side of the display 420 in order to prevent the antenna device from overlapping a main circuit board. A speaker module 441 for a receiver, the ambient light sensors 442 and 443, the front camera 444, and a camera module may be disposed on the upper side of the display 420, and these components may have predetermined sizes. Accordingly, the antenna device may be disposed on the upper right or left side of the display 420.

Figure 2:
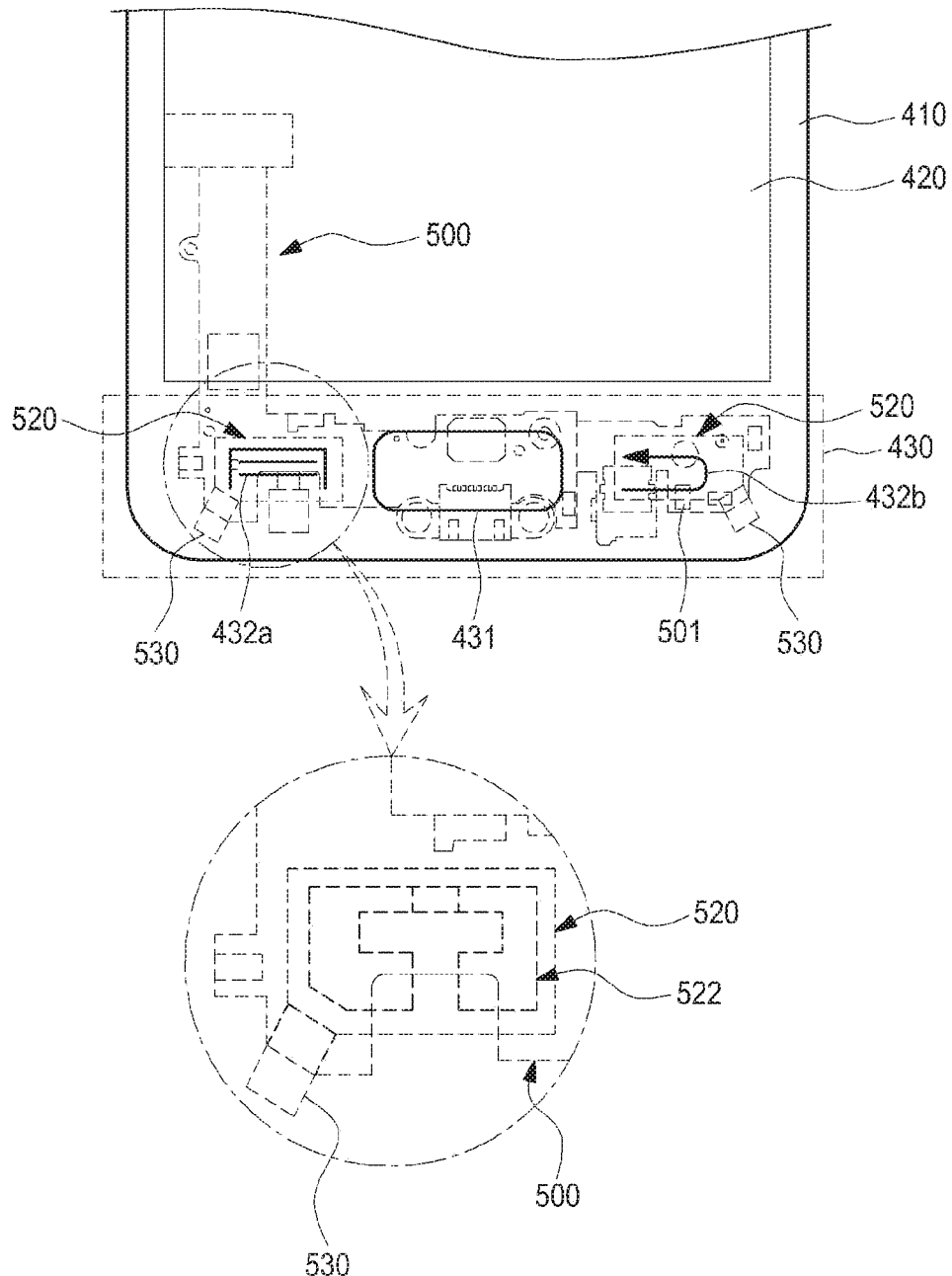
FIG. 2 illustrates a touch pad disposed on the lower inner side of the electronic device according to an embodiment of the present disclosure.

FIG. 2 illustrates a touch pad 500 disposed on the lower inner side of the electronic device 400 according to an embodiment of the present disclosure.

Referring to FIG. 2, the touch pad 500 may be disposed on the lower side of the display 420, and a feeding part 501 of the antenna device and detection members 520 disposed below the menu key 432a and the back key 432b may be stacked on the touch pad 500 while sharing a mounting position. The touch pad 500 is illustrated as having a structure that corresponds to the keypad 430 of the electronic device 400 illustrated in FIG. 1, and reference may be made to FIG. 1 in the description of a specific embodiment of the present disclosure according to necessity.

Since the antenna device transmits and receives high-frequency signals, the antenna device has to be mounted to prevent interference with other circuit components (that is, the touch pad 500 disposed inside the keypad 430). Accordingly, in an embodiment of the present disclosure, detection patterns 522 mounted on the touch pad 500 are open to form an antenna radiation path so that it is possible to prevent the radiation performance of the antenna device (specifically, the feeding part 501 of the antenna device) from being degraded by the detection patterns 522 of the touch pad 500.

Figure 3:
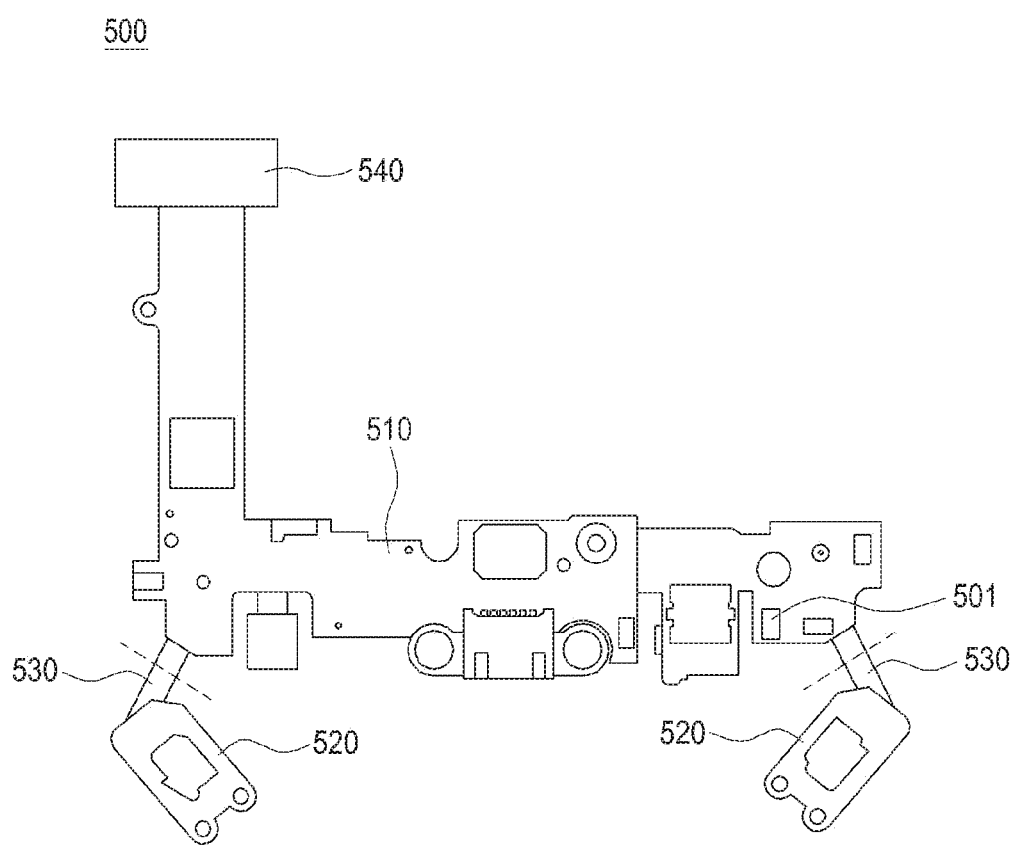
FIG. 3 illustrates one surface of the touch pad in the electronic device according to an embodiment of the present disclosure.
Figure 4A:
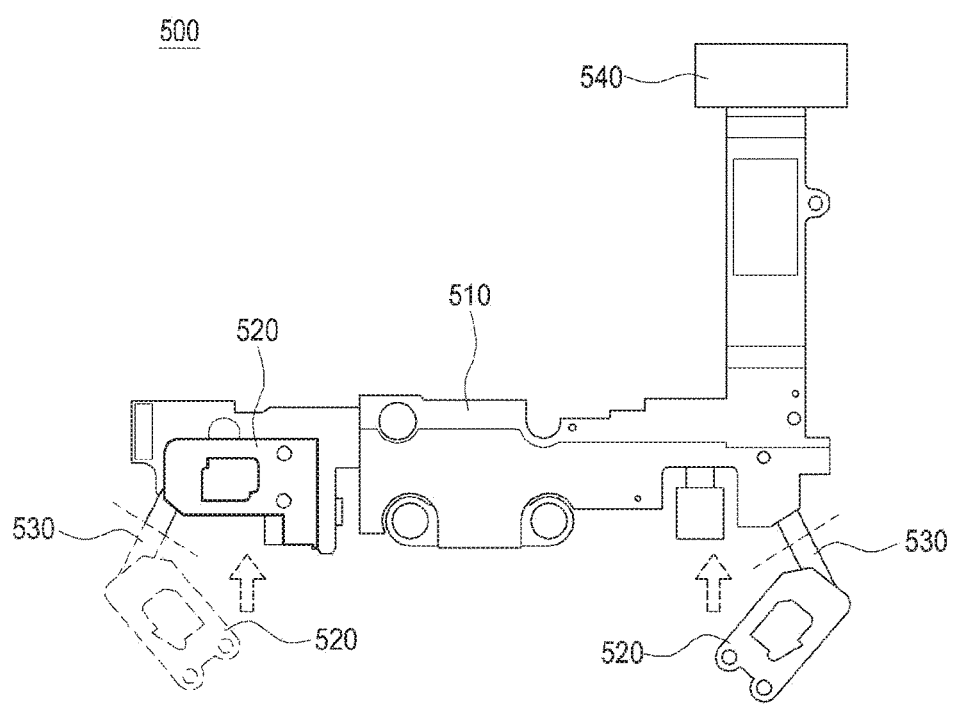
FIG. 4A illustrates an opposite surface of the touch pad of FIG. 3 in the electronic device according to an embodiment of the present disclosure.
Figure 4B:
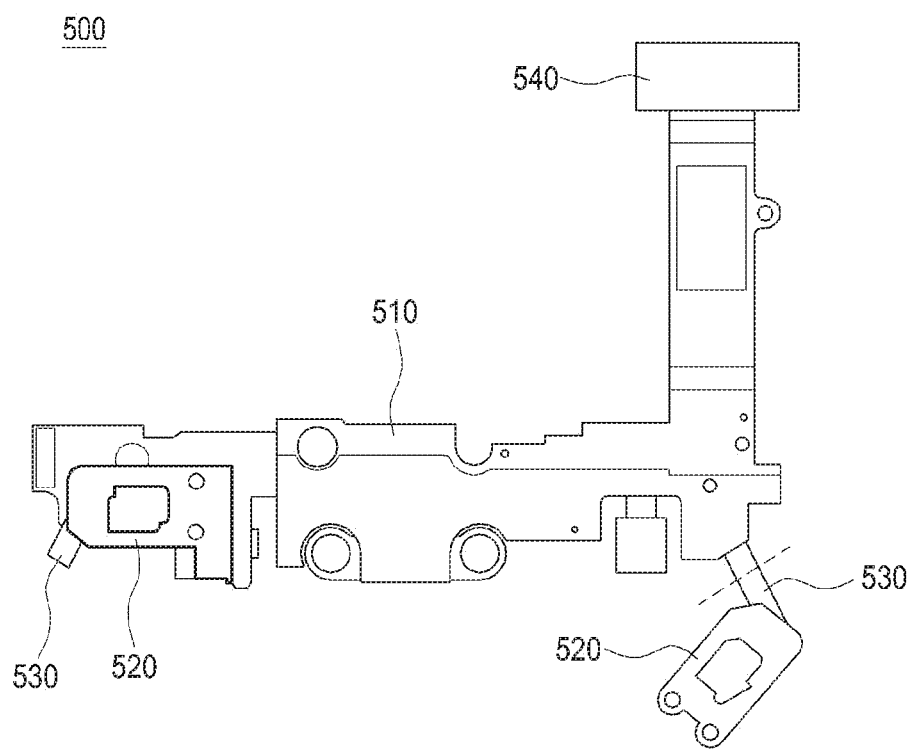
FIG. 4B illustrates a state in which a detection member has been stacked on a circuit board member when viewed from above the opposite surface of the touch pad of the electronic device according to an embodiment of the present disclosure.
Figure 5:
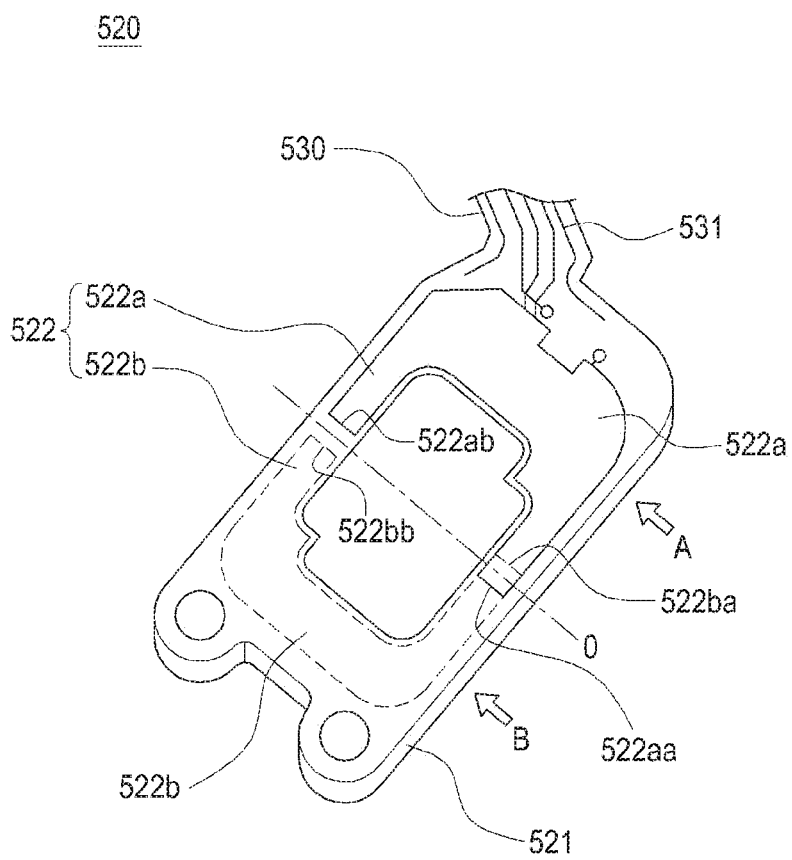
FIG. 5 illustrates the detection member in the touch pad according to an embodiment of the present disclosure.
Figure 6A:
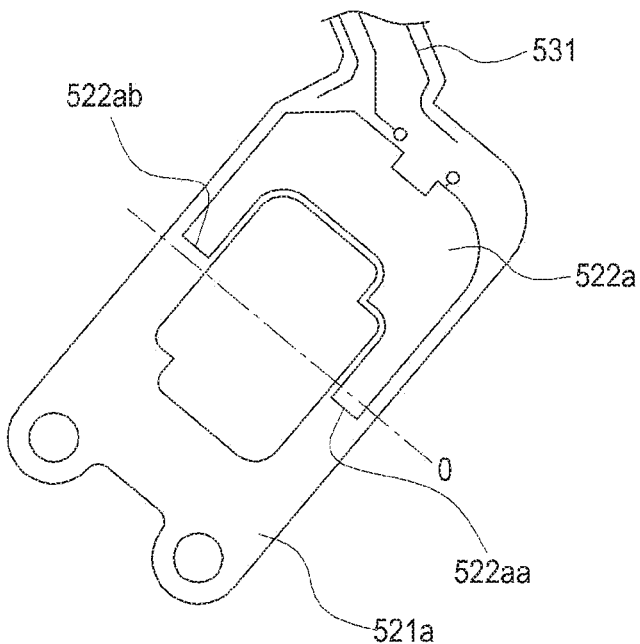
FIG. 6A illustrates a plan view of a first film of the detection member in the electronic device according to an embodiment of the present disclosure.
Figure 6B:
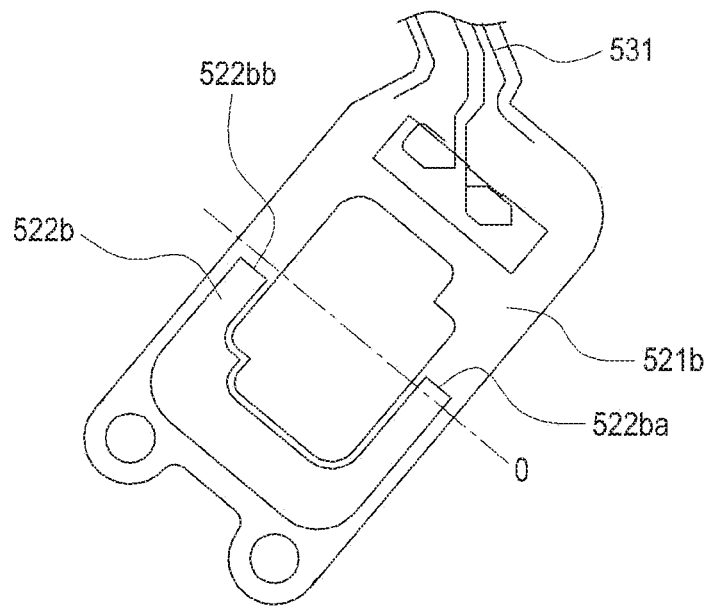
FIG. 6B illustrates a plan view of a second film of the detection member in the electronic device according to an embodiment of the present disclosure.
Figure 6C:
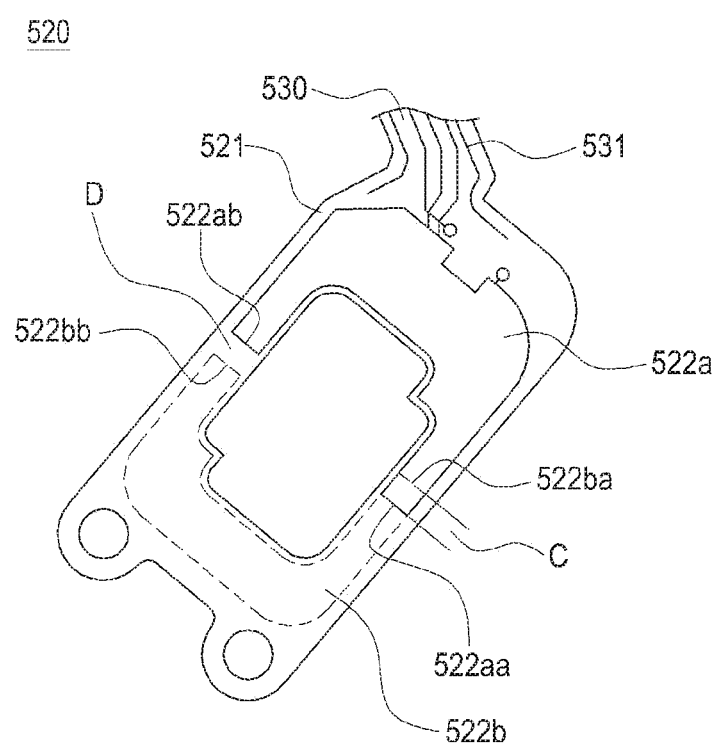
FIG. 6C illustrates a plan view showing a state in which the first and second films have been stacked on each other in the electronic device according to an embodiment of the present disclosure.
Figure 7:
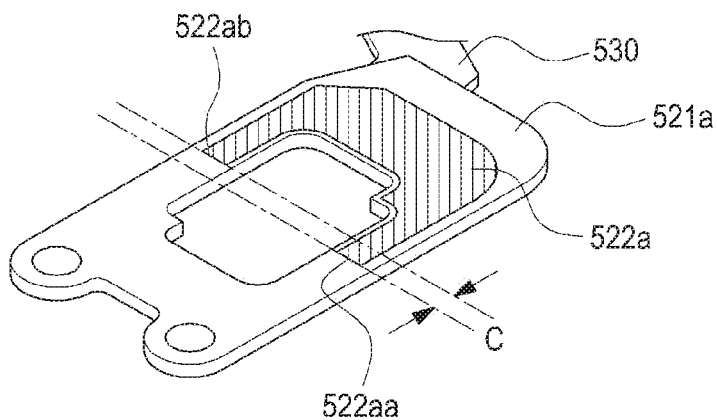
FIG. 7 illustrates a perspective view showing a state in which the first and second films have been separated from each other in the electronic device according to an embodiment of the present disclosure.
Figure 7:
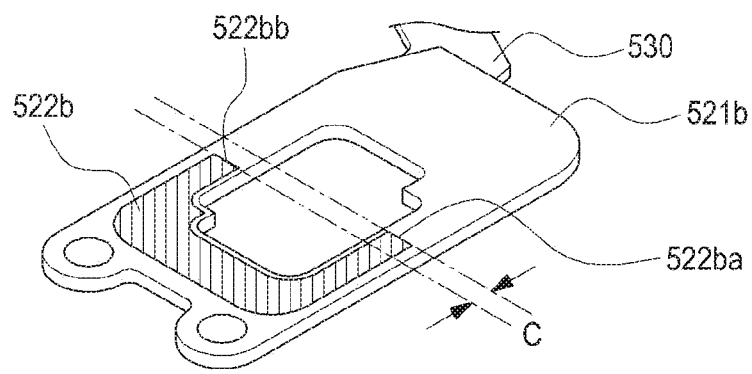
Figure 8:
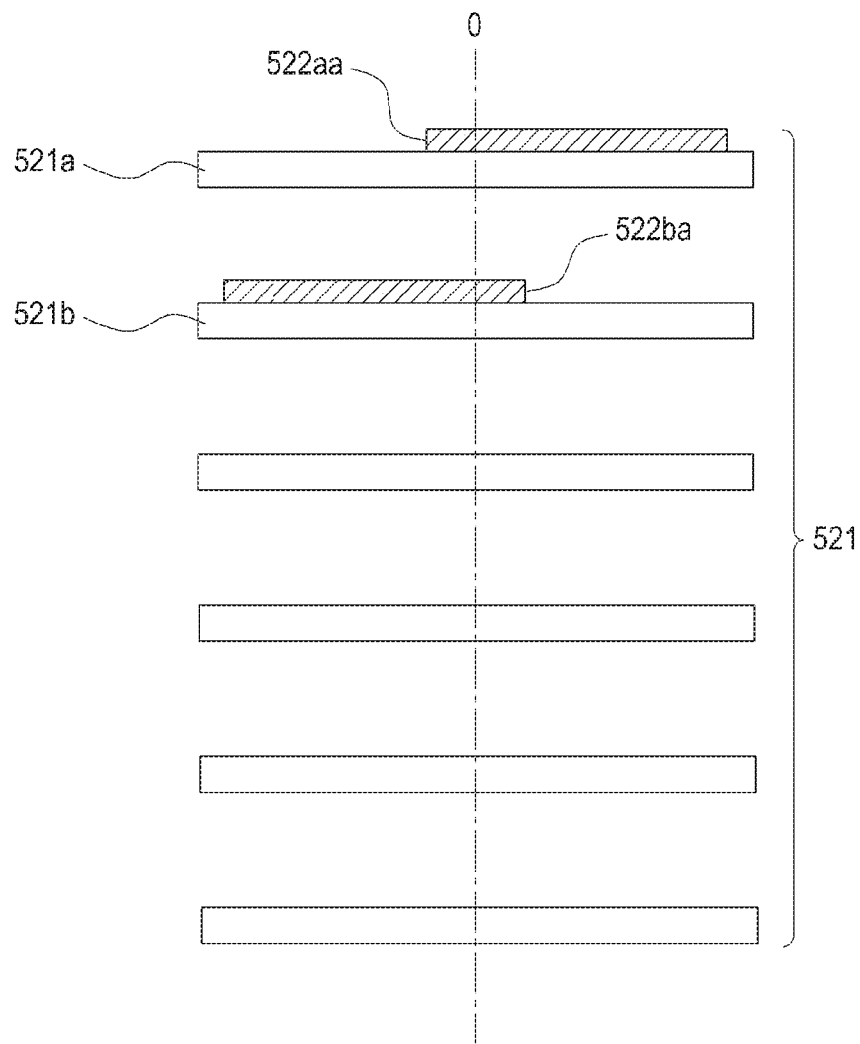
FIG. 8 illustrates a schematic sectional view of the detection member in the electronic device according to an embodiment of the present disclosure.

FIG. 3 illustrates one surface of the touch pad 500 to be mounted in the electronic device 400 according to an embodiment of the present disclosure. FIG. 4A illustrates an opposite surface of the touch pad 500 to be mounted in the electronic device 400 according to an embodiment of the present disclosure. FIG. 4B illustrates a state in which the detection member 520 has been stacked on a circuit board member 510 when viewed from above the opposite surface of the touch pad 500 of the electronic device 400 according to an embodiment of the present disclosure. FIG. 5 illustrates the detection member 520 in the touch pad 500 according to an embodiment of the present disclosure. FIG. 6A illustrates a plan view of a first film 521a of the detection member 520 to be mounted in the electronic device 400 according to an embodiment of the present disclosure. FIG. 6B illustrates a plan view of a second film 521b of the detection member 520 to be mounted in the electronic device 400 according to an embodiment of the present disclosure. FIG. 6C illustrates a plan view showing a state in which the first and second films 521a and 521b have been stacked on each other in the electronic device 400 according to an embodiment of the present disclosure. FIG. 7 illustrates a perspective view showing a state in which the first and second films 521a and 521b have been separated from each other in the electronic device 400 according to an embodiment of the present disclosure. FIG. 8 illustrates a schematic sectional view of the detection member 520 in the electronic device 400 according to an embodiment of the present disclosure.

Referring to FIGS. 3 to 8, the touch pad 500 may include one or more detection members 520 stacked on one surface of the circuit board member 510 to detect a signal caused by proximity or contact. As shown in FIG. 5, each detection member 520 may have a detection pattern 522 formed thereon. The detection pattern 522 may be divided into two patterns that are formed on different layers to form an overlapping area C and a slit area D, as shown in FIG. 6C. A high-frequency signal of the antenna device may be blocked and distorted by the detection pattern 522 formed of a conductive material. However, since the detection pattern 522 is divided into the two patterns, which are formed on the different film layers, and a high-frequency signal radiated from the antenna device travels through the space between the two patterns divided from each other and through the slit area D, it is possible to prevent the signal radiated from the antenna device from being blocked or distorted by the detection pattern 522.

As shown in FIG. 3, the circuit board member 510 may be connected with a main circuit board mounted in the housing 410 and may have a single layer or two or more layers. The feeding part 501 of the antenna device may be mounted on one surface of the circuit board member 510, and the detection member 520 may be provided below the area (hereinafter, the mounting area) in which the feeding part 501 is mounted. At least one keypad 430 may be provided on the circuit board member 510. According to one embodiment, the keypad 430 may include a physical home key 431 and a menu key 432a and a back key 432b that are mounted on opposite sides of the home key 431. The detection members 520 may correspond to the menu key 432a and the back key 432b of the keypad 430 illustrated in FIG. 1.

Connectors 530 made of a conductive material may be provided on opposite ends of the circuit board member 510. The touch pad 500 may be connected to the main circuit board of the electronic device 400 by the connectors 530. In addition, a plurality of conducting wires 531 may be formed on the circuit board member 510 and may be electrically connected with the detection members 520. The conducting wires may extend with each connector 530, as shown in FIGS. 5, 6A, 6B and 6C.

The detection members 520 may be mounted on at least some areas of the circuit board member 510 (for example, on the areas corresponding to the positions of the menu key 432a and the back key 432b). As described above, the detection member 520 may be stacked to share the mounting area of the feeding part 501 of the antenna device on one surface of the circuit board member 510.

Referring to FIG. 5, the detection member 520 may include a substrate 521 having a plurality of film layers and the detection pattern 522 that is formed on one surface of the substrate 521 by patterning of the conductive material thereon and detects proximity or contact of an object.

The substrate 521 may be provided in the mounting area and may have a plurality of films stacked one above another. The detection pattern 522 may have a C-shape or an O-shape and may have the slit area D that is open at one area of the detection pattern. The C-shaped or O-shaped detection pattern 522 may be divided into a first pattern 522a and a second pattern 522b. The first and second patterns 522a and 522b may be formed on different films of the substrate 521.

For example, the substrate 521 may have a plurality of films stacked thereon. One of the detection patterns 522, which is the first pattern 522a, may be formed on one of the plurality of stacked films, which is the first layer or the first film 521a, and the other pattern, which is the second pattern 522b, may be formed on a film stacked adjacent to the first film 521a, the film being the second layer or the second film 521b. The first pattern 522a and the second pattern 522b are made of a conductive material are formed on the first film 521a and the second film 521b, respectively.

As shown in FIG. 5, the substrate 521 may be divided into a first area A and a second area B with respect to the central portion O thereof. The first pattern 522a may be disposed in the first area A, and the second pattern 522b may be disposed in the second area B.

The first pattern 522a may be formed in a ∩-shape in the first area A of one surface of the first film 521a, and the second pattern 522b may be formed in a ∪-shape in the second area B of one surface of the second film 521b. When the first film 521a and the second film 521b are stacked on each other, at least one area of the first pattern 522a and at least one area of the second pattern 522b may overlap each other to form an overlapping area C, and at least one area of the first pattern 522a and at least one area of the second pattern 522b may form a slit area D. Accordingly, when the first film 521a having the first pattern 522a formed thereon and the second film 521b having the second pattern 522b formed thereon are stacked on each other, the detection pattern 522 may have the C-shape or the O-shape.

As shown in FIGS. 7 and 8, one end portion 522aa of the ∩-shaped first pattern 522a may be longer than an opposite end portion 522ab thereof, and one end portion 522ba of the ∪-shaped second pattern 522b may be longer than an opposite end portion 522bb thereof. Specifically, the end portion 522aa of the first pattern 522a may extend from the first area A toward the second area B, and the end portion 522ba of the second pattern 522b may extend from the second area B toward the first area A. Accordingly, the end portion 522aa of the first pattern 522a and the end portion 522ba of the second pattern 522b may be vertically spaced apart from each other, but may overlap each other when viewed from above. In addition, the opposite end portion 522ab of the first pattern 522a and the opposite end portion 522bb of the second pattern 522b may be formed shorter than the end portions 522aa and 522ba with respect to the central portion O of the substrate 521 so that the opposite end portion of the first pattern 522a and the opposite end portion of the second pattern 522b may be vertically and horizontally spaced apart from each other. Accordingly, the detection pattern 522 may have a curvilinear shape in which the first pattern 522a and the second pattern 522b are stacked so as to be vertically misaligned with each other and are connected with each other through the overlapping area C and one portion of the detection pattern 522 is open through the slit area D. Namely, the detection pattern 522 may have the C-shape or the O-shape in which the first pattern 522a and the second pattern 522b are disposed on different layers in the sectional view and are connected with each other through the overlapping area C and open through the slit area D in the plan view, while the first film 521a and the second film 521 are stacked on each other.

Furthermore, one of the first pattern 522a and the second pattern 522b may be electrically connected with the plurality of conducting wires, which will be described below. When current is applied to the first or second pattern 522a or 522b connected with the plurality of conducting wires 531, coupling may be generated in the overlapping area C of the first and second patterns 522a and 522b, and the current may be introduced into the first or second pattern 522a or 522b that is not connected with the plurality of conducting wires, whereby proximity or contact may be detected through the C-shaped or O-shaped detection pattern 522.

The plurality of conducting wires 531 made of a conductive material may be provided on the substrate 521 (for example, at least one of the first and second films 521a and 521b) so as to be electrically connected with at least one of the first and second patterns 522a and 522b. Furthermore, the substrate 521 may further include a connector 530 electrically connected with the circuit board member 510, and the plurality of conducting wires 531 may be stacked on the connector 530 and on one surface of the circuit board member 510 connected with the connector 530 to electrically connect the detection member 520 and the circuit board member 510.

As described above, the touch pad 500, according to the present disclosure, may be disposed to correspond to the keypad 430 disposed on one side of the display 420, and the detection pattern 522 of the detection member 520, which is made of a conductive material, may be divided into two parts that are formed on the different layers, which makes it possible to pass a high-frequency signal (specifically, a signal radiated from the antenna device) without blocking or distorting the same. Accordingly, the touch pad 500 and the antenna device can maintain the optimal performance thereof even through the touch pad 500 and the antenna device are disposed in a stack structure within the internal space of the terminal.

The above-configured touch pad for an electronic device can pass a radiation signal of an antenna device by dividing the detection pattern, which detects a user's contact (i.e., input operation), into two parts and forming the same on different film layers. Namely, even though the antenna device and the touch pad are disposed in a stack structure, the antenna device can efficiently radiate a signal through the first and second patterns that are formed on the different layers so as to be misaligned with each other. Accordingly, it is possible to maintain the optimized performance of the antenna device even though the circuit components, including the touch pad, according to the present disclosure, are disposed close to the antenna device in a stack structure. In addition, it is possible to efficiently utilize the mounting space since the antenna device and the touch pad may be installed close to each other in a stack structure while maintaining the optimized performance thereof.

Hereinafter, an electronic device according to an embodiment of the present disclosure will be described with reference to the accompanying drawings. In the present disclosure, the term "user" may indicate a person using an electronic device or a device (e.g., an artificial intelligence electronic device) using an electronic device.

Figure 9:
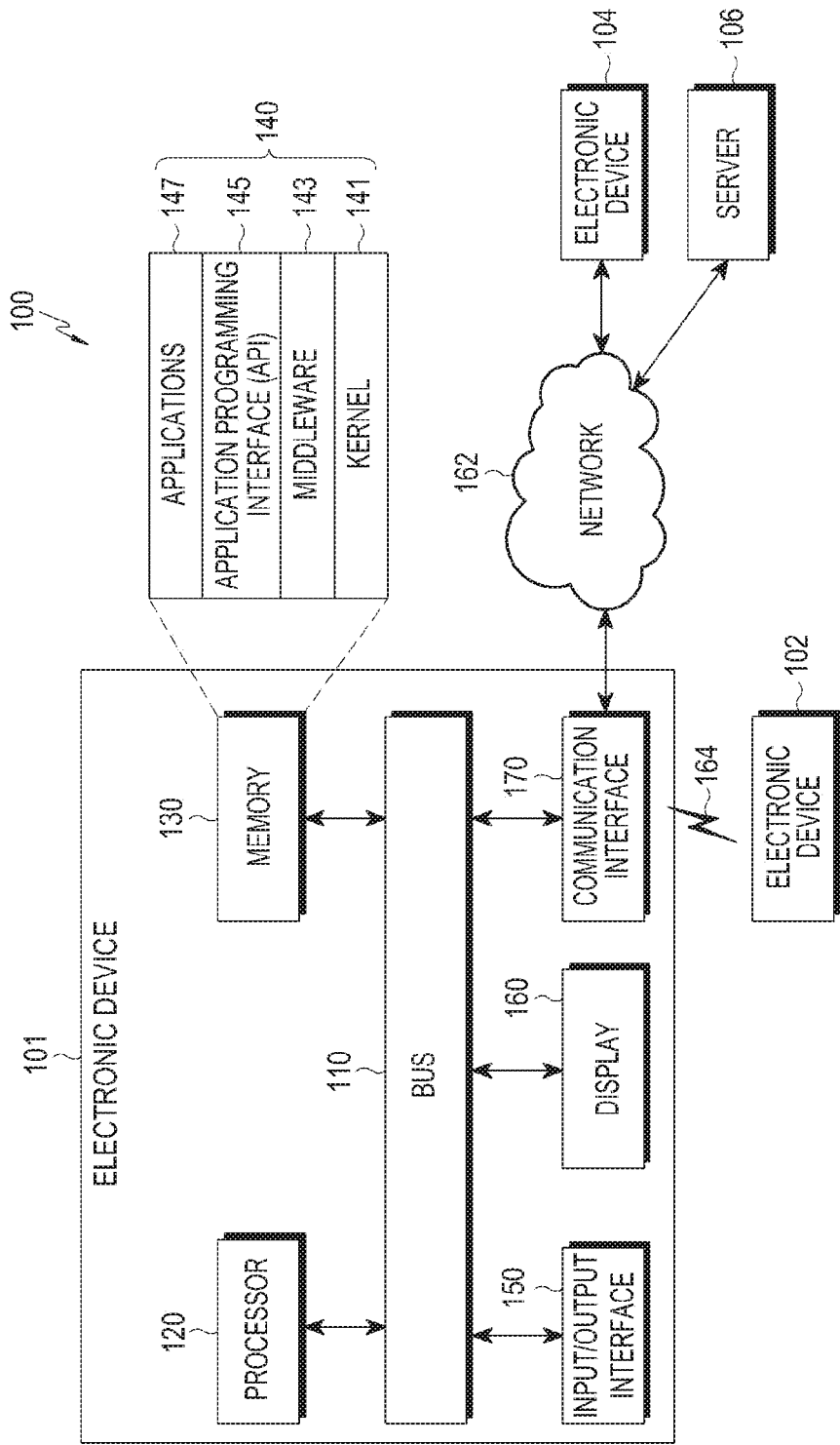
FIG. 9 illustrates a block diagram of an electronic device within a network environment according to an embodiment of the present disclosure.

FIG. 9 illustrates a block diagram of an electronic device within a network environment according to an embodiment of the present disclosure.

An electronic device 101 within a network environment 100 will be described with reference to FIG. 9. The electronic device 101 may include a bus 110, a processor 120, a memory 130, an input/output interface 150, a display 160, and a communication interface 170. In some embodiments, the electronic device 101 may omit at least one of the elements, or may further include other elements.

The bus 110 may include, for example, a circuit that interconnects the elements 110 to 170 and delivers communication (for example, a control message and/or data) between the elements 110 to 170.

The processor 120 may include one or more of a Central Processing Unit (CPU), an Application Processor (AP), and a Communication Processor (CP). The processor 120, for example, may carry out operations or data processing relating to the control and/or communication of at least one other element of the electronic device 101.

The memory 130 may include a volatile and/or non-volatile memory. The memory 130 may store, for example, instructions or data relevant to at least one other element of the electronic device 101. The memory 130 may store software and/or a program 140. The program 140 may include a kernel 141, middleware 143, an Application Programming Interface (API) 145, and/or application programs (or "applications") 147. At least some of the kernel 141, the middleware 143, and the API 145 may be referred to as an Operating System (OS).

The kernel 141, for example, may control or manage system resources (for example, the bus 110, the processor 120, the memory 130, etc.) that are used for executing operations or functions implemented by the other programs (for example, the middleware 143, the API 145, and the applications 147). Furthermore, the kernel 141 may provide an interface through which the middleware 143, the API 145, or the applications 147 may access the individual elements of the electronic device 101 to control or manage the system resources.

The middleware 143, for example, may serve as an intermediary to allow the API 145 or the applications 147 to communicate with the kernel 141 to exchange data.

Furthermore, the middleware 143 may process one or more task requests received from the applications 147 according to the priorities thereof. For example, the middleware 143 may assign priorities for using the system resources of the electronic device 101 to one or more of the applications 147. For example, the middleware 143 may perform scheduling or load balancing on the one or more task requests by processing the one or more task requests according to the priorities assigned to the one or more application programs.

The API 145, which is an interface through which the applications 147 control functions provided by the kernel 141 or the middleware 143, may include, for example, at least one interface or function (for example, instruction) for file control, window control, image processing, text control, etc.

The input/output interface 150, for example, may serve as an interface that forwards instructions or data input from a user or another external device to the other element(s) of the electronic device 101. Furthermore, the input/output interface 150 may output instructions or data received from the other element(s) of the electronic device 101 to the user or the external device.

Examples of the display 160 may include a Liquid Crystal Display (LCD), a Light-Emitting Diode (LED) display, an Organic Light-Emitting Diode (OLED) display, a Micro-ElectroMechanical Systems (MEMS) display, and an electronic paper display. The display 160 may display, for example, various types of content (for example, text, images, videos, icons, symbols, etc.) for a user. The display 160 may include a touch screen and may receive, for example, a touch, gesture, proximity, or hovering input using an electronic pen or a part of a user's body.

The communication interface 170 may configure, for example, communication between the electronic device 101 and an external device (for example, a first external electronic device 102, a second external electronic device 104, or a server 106). For example, the communication interface 170 may be connected to a network 162 through wireless or wired communication to communicate with the external device.

The wireless communication may use, for example, at least one of Long Term Evolution (LTE), LTE-Advance (LTE-A), Code Division Multiple Access (CDMA), Wideband CDMA (WCDMA), Universal Mobile Telecommunications System (UMTS), WiBro (Wireless Broadband), Global System for Mobile Communications (GSM), and the like, for example, as a cellular communication protocol. In addition, the wireless communication may include, for example, short range communication. The short range communication may include, for example, at least one of Wi-Fi, Bluetooth, Near Field Communication (NFC), Global Navigation Satellite System (GNSS), etc. The GNSS may include, for example, at least one of a Global Positioning System (GPS), a Global Navigation Satellite System (Glonass), a Beidou Navigation Satellite System (Beidou), and a European Global Satellite-based Navigation System (Galileo), according to a place of usage, a bandwidth, or the like. Hereinafter, the term "GPS" may be interchangeably used with the term "GNSS" in the present disclosure. The wired communication may include, for example, at least one of a Universal Serial Bus (USB), a High Definition Multimedia Interface (HDMI), Recommended Standard 232 (RS-232), a Plain Old Telephone Service (POTS), etc. The network 162 may include at least one of a communication network (such as a computer network (for example, a LAN or a WAN)), the Internet, and a telephone network.

Each of the first and second external electronic devices 102 and 104 may be of a type that is the same as, or different from, that of the electronic device 101. The server 106 may include a group of one or more servers. All or some of the operations executed in the electronic device 101 may be executed in another electronic device or a plurality of electronic devices 102 and 104 or the server 106. When the electronic device 101 has to perform some functions or services automatically or in response to a request, the electronic device 101 may request another device 102 or 104 or the server 106 to perform at least some functions relating to the functions or services, instead of, or in addition to, executing the functions or services by itself. The other electronic device may execute the requested functions or the additional functions and may transmit the execution result to the electronic device 101. The electronic device 101 may provide the received result as it is, or may additionally process the received result to provide the requested functions or services. To this end, for example, cloud computing, distributed computing, or client-server computing technology may be used.

Figure 10:
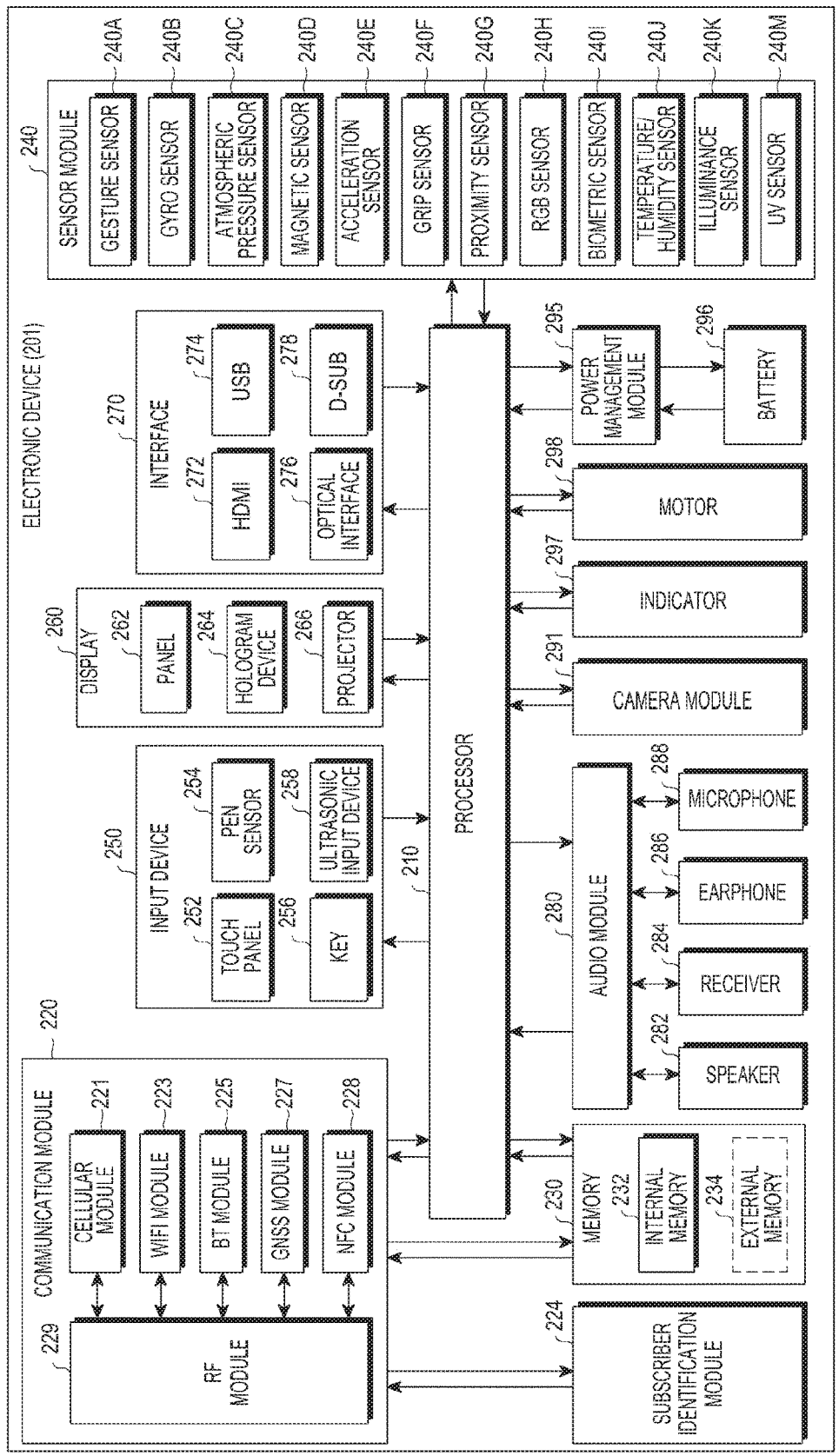
FIG. 10 illustrates a block diagram of an electronic device according to an embodiment of the present disclosure.

FIG. 10 is a block diagram of an electronic device 201 according to various embodiments.

The electronic device 201 may include, for example, the entirety or a part of the electronic device 101 illustrated in FIG. 9. The electronic device 201 may include at least one Application Processor (AP) 210, a communication module 220, a subscriber identification module 224, a memory 230, a sensor module 240, an input device 250, a display 260, an interface 270, an audio module 280, a camera module 291, a power management module 295, a battery 296, an indicator 297, and a motor 298. The processor 210 may drive, for example, an operating system or application programs to control a plurality of hardware or software elements connected thereto and may perform various types of data processing and operations. The processor 210 may be embodied, for example, as a System on Chip (SoC). The processor 210 may further include a Graphic Processing Unit (GPU) and/or an image signal processor. The processor 210 may also include at least some (for example, a cellular module 221) of the elements illustrated in FIG. 10. The processor 210 may load, in a volatile memory, instructions or data received from at least one of the other elements (for example, a non-volatile memory) to process the same and may store the result data in the non-volatile memory.

The communication module 220 may have a configuration that is the same as, or similar to, that of the communication interface 170. The communication module 220 may include, for example, the cellular module 221, a Wi-Fi module 223, a Bluetooth (BT) module 225, a GNSS module 227, an NFC module 228, and an RF module 229. The cellular module 221 may provide, for example, a voice call, a video call, a text message service, an Internet service, or the like through a communication network. The cellular module 221 may identify and authenticate the electronic device 201 within a communication network using the subscriber identification module 224 (for example, a SIM card). The cellular module 221 may perform at least some of the functions that the processor 210 may provide, and the cellular module 221 may include a Communication Processor (CP). At least some (for example, two or more) of the cellular module 221, the Wi-Fi module 223, the Bluetooth module 225, the GNSS module 227, and the NFC module 228 may be included in one Integrated Chip (IC) or IC package. The RF module 229 may transmit/receive, for example, a communication signal (for example, an RF signal). The RF module 229 may include, for example, a transceiver, a Power Amp Module (PAM), a frequency filter, a Low Noise Amplifier (LNA), an antenna, etc. At least one of the cellular module 221, the Wi-Fi module 223, the Bluetooth module 225, the GNSS module 227, and the NFC module 228 may transmit/receive RF signals through a separate RF module. The SIM 224 may include, for example, a card that includes a subscriber identification module, or an embedded SIM, and may contain unique identification information (for example, an Integrated Circuit Card Identifier (ICCID)) or subscriber information (for example, International Mobile Subscriber Identity (IMSI)).

The memory 230 may include, for example, an internal memory 232 or an external memory 234. The internal memory 232 may include, for example, at least one of a volatile memory (for example, a DRAM, an SRAM, an SDRAM, etc.) and a non-volatile memory (for example, a One Time Programmable ROM (OTPROM), a PROM, an EPROM, an EEPROM, a mask ROM, a flash ROM, a flash memory, a hard disc drive, or a Solid State Drive (SSD)). The external memory 234 may include a flash drive, which may be, for example, a Compact Flash (CF), a Secure Digital (SD), a Micro-SD, a Mini-SD, an extreme Digital (xD), a Multi-Media Card (MMC), a memory stick, etc. The external memory 234 may be functionally or physically connected with the electronic device 201 through various interfaces.

The sensor module 240, for example, may measure a physical quantity or detect the operating state of the electronic device 201 and may convert the measured or detected information into an electrical signal. The sensor module 240 may include, for example, at least one of a gesture sensor 240A, a gyro sensor 240B, an atmospheric pressure sensor 240C, a magnetic sensor 240D, an acceleration sensor 240E, a grip sensor 240F, a proximity sensor 240G, a color sensor 240H (for example, a Red, Green, and Blue (RGB) sensor), a biometric sensor 240I, a temperature/humidity sensor 240J, an illuminance sensor 240K, and a ultraviolet (UV) sensor 240M. Additionally or alternatively, the sensor module 240 may include, for example, an e-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 240 may further include a control circuit for controlling the one or more sensors included therein. The electronic device 201 may further include a processor configured to control the sensor module 240 as a part of the processor 210, or separately from the processor 210, in order to control the sensor module 240 while the processor 210 is in a sleep state.

The input device 250 may include, for example, a touch panel 252, a (digital) pen sensor 254, a key 256, or an ultrasonic input device 258. The touch panel 252 may use, for example, at least one of a capacitive type, a resistive type, an infrared type, and an ultrasonic type. Furthermore, the touch panel 252 may further include a control circuit. The touch panel 252 may further include a tactile layer and may provide a tactile reaction for a user. The (digital) pen sensor 254 may include, for example, a recognition sheet that is a part of, or separate from, the touch panel. The key 256 may include, for example, a physical button, an optical key, or a keypad. The ultrasonic input device 258 may detect ultrasonic waves generated by an input tool through a microphone 288 and may identify data corresponding to the detected ultrasonic waves.

The display 260 may include a panel 262, a hologram device 264, or a projector 266. The panel 262 may include a configuration that is the same as, or similar to, that of the display 160 illustrated in FIG. 9. The panel 262 may be implemented to be, for example, flexible, transparent, or wearable. The panel 262, together with the touch panel 252, may be implemented as one module. The hologram device 264 may show a three-dimensional image in the air using interference of light. The projector 266 may project light onto a screen to display an image. The screen may be located, for example, in the interior of, or on the exterior of, the electronic device 201. The display 260 may further include a control circuit for controlling the panel 262, the hologram device 264, or the projector 266.

The interface 270 may include, for example, an HDMI 272, a USB 274, an optical interface 276, or a D-subminiature (D-sub) 278. The interface 270 may be included, for example, in the communication interface 170 illustrated in FIG. 9. Additionally or alternatively, the interface 270 may, for example, include a Mobile High-definition Link (MHL) interface, an SD card/Multi-Media Card (MMC) interface, or an Infrared Data Association (IrDA) standard interface.

The audio module 280, for example, may convert a sound into an electrical signal, and vice versa. At least some elements of the audio module 280 may be included, for example, in the input/output interface 150 illustrated in FIG. 9. The audio module 280 may process sound information that is input or output through, for example, a speaker 282, a receiver 284, earphones 286, the microphone 288, etc. The camera module 291, which is a device that can photograph a still image and a moving image, may include one or more image sensors (for example, a front sensor or a rear sensor), a lens, an Image Signal Processor (ISP), or a flash (for example, an LED or xenon lamp).

The power management module 295 may manage, for example, power of the electronic device 201. The power management module 295 may include a Power Management Integrated Circuit (PMIC), a charger IC, or a battery gauge. The PMIC may use a wired and/or wireless charging method. Examples of the wireless charging method may include a magnetic resonance method, a magnetic induction method, an electromagnetic wave method, etc. Additional circuits (for example, a coil loop, a resonance circuit, a rectifier, etc.) for wireless charging may be further included.

The battery gauge may measure, for example, a residual quantity of the battery 296, and a voltage, a current, or a temperature while charging. The battery 296 may include, for example, a rechargeable battery and/or a solar battery.

The indicator 297 may indicate a particular state (for example, a booting state, a message state, a charging state, etc.) of the electronic device 201 or a part thereof (for example, the processor 210). The motor 298 may convert an electrical signal into a mechanical vibration and may generate a vibration, a haptic effect, etc. The electronic device 201 may include a mobile TV support device (e.g., a GPU) that can process media data according to a standard, such as Digital Multimedia Broadcasting (DMB), Digital Video Broadcasting (DVB), mediaFlo™, etc. Each of the above-described component elements of hardware according to the present disclosure may be configured with one or more components, and the names of the corresponding component elements may vary based on the type of electronic device. The electronic device may not include some elements or further include additional elements. Some of elements are coupled to constitute one object but the electronic device may perform the same functions as those which the corresponding elements have before being coupled to each other.

Each of the above-described component elements of hardware according to the present disclosure may be configured with one or more components, and the names of the corresponding component elements may vary based on the type of electronic device. The electronic device may include at least one of the aforementioned elements. Some elements may be omitted or other additional elements may be further included in the electronic device. Also, some of the hardware components may be combined into one entity, which may perform functions identical to those of the relevant components before the combination.

Figure 11:
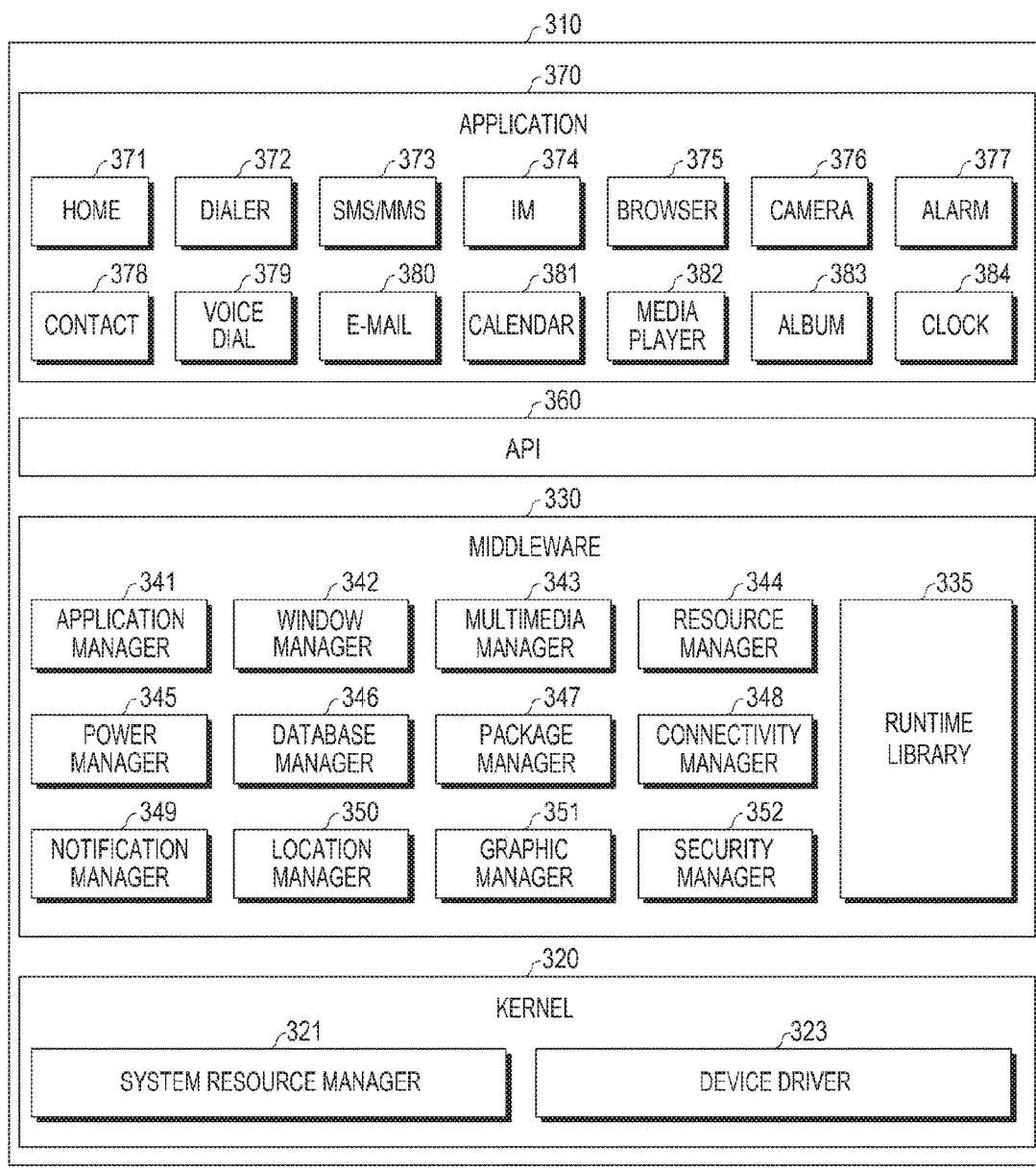
FIG. 11 illustrates a block diagram of a program module according to an embodiment of the present disclosure.

FIG. 11 is a block diagram of a program module according to various embodiments. According to one embodiment, the program module 310 (for example, the program 140) may include an Operating System (OS) that controls resources relating to an electronic device (for example, the electronic device 101) and/or various applications (for example, the application programs 147) that are executed on the operating system. The operating system may be, for example, Android, iOS, Windows, Symbian, Tizen, Bada, etc.

The program module 310 may include a kernel 320, middleware 330, an Application Programming Interface (API) 360, and/or applications 370. At least a part of the program module 310 may be preloaded on the electronic device, or may be downloaded from an external electronic device (for example, the electronic device 102 or 104 or the server 106).

The kernel 320 may include, for example, a system resource manager 321 and/or a device driver 323. The system resource manager 321 may control, allocate, or retrieve system resources. The system resource manager 321 may include a process manager, a memory manager, or a file system manager. The device driver 323 may include, for example, a display driver, a camera driver, a Bluetooth driver, a shared-memory driver, a USB driver, a keypad driver, a Wi-Fi driver, an audio driver, or an Inter-Process Communication (IPC) driver.

The middleware 330, for example, may provide functions required by the applications 370 in common, or may provide various functions to the applications 370 through the API 360 to enable the applications 370 to efficiently use limited system resources within the electronic device. The middleware 330 may include at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, and a security manager 352.

The runtime library 335 may include, for example, a library module used by a compiler to add new functions through programming languages while the applications 370 are being executed. The runtime library 335 may perform input/output management, memory management, the functionality for an arithmetic function, etc.

The application manager 341 may manage, for example, the life cycle of at least one of the applications 370. The window manager 342 may manage GUI resources used on a screen. The multimedia manager 343 may identify formats required for reproducing various media files and may encode or decode media files using a codec suitable for the corresponding format. The resource manager 344 may manage resources (such as the source code, the memory, the storage space, etc.) of at least one of the applications 370.

The power manager 345, for example, may operate together with a Basic Input/Output System (BIOS) to manage a battery or power and may provide power information required for the operation of the electronic device. The database manager 346 may generate, search, and/or change a database to be used by at least one of the applications 370. The package manager 347 may manage the installation or update of an application that is distributed in the form of a package file.

The connectivity manager 348 may manage wireless connection, such as Wi-Fi, Bluetooth, etc. The notification manager 349 may display or notify of an event (such as an arrival message, an appointment, a proximity notification, etc.) in such a manner as not to disturb a user. The location manager 350 may manage location information of the electronic device. The graphic manager 351 may manage a graphic effect to be provided for a user and a user interface relating thereto. The security manager 352 may provide various security functions required for system security, user authentication, etc. Where the electronic device has a telephone call function, the middleware 330 may further include a telephony manager for managing a voice or video call function of the electronic device.

The middleware 330 may include a middleware module that forms a combination of various functions of the above-described elements. The middleware 330 may provide specialized modules according to the types of operating systems in order to provide differentiated functions. Furthermore, the middleware 330 may dynamically remove some of the existing elements, or may add new elements.

The API 360 is, for example, a set of API programming functions, and may be provided with different configurations according to operating systems. For example, in the case of Android or iOS, one API set may be provided for each platform, and in the case of Tizen, two or more API sets may be provided for each platform.

The applications 370 may include one or more applications that can perform functions, for example, home 371, dialer 372, SMS/MMS 373, Instant Message (IM) 374, browser 375, camera 376, alarm 377, contacts 378, voice dial 379, e-mail 380, calendar 381, media player 382, album 383, clock 384, health care (for example, measuring exercise quantity or blood sugar level), and environment information (for example, atmospheric pressure, humidity, temperature information, etc.).

The applications 370 may include an information exchange application that supports information exchange between the electronic device and an external electronic device. The information exchange application may include, for example, a notification relay application for forwarding specific information to the external electronic device or a device management application for managing the external electronic device.

For example, the notification relay application may include a function of delivering, to the external electronic device, notification information generated by the other applications (for example, the SMS/MMS application, the e-mail application, the health care application, the environmental information application, etc.) of the electronic device. Furthermore, the notification relay application, for example, may receive notification information from the external electronic device and may provide the received notification information for a user.

The device management application may manage (for example, install, delete, or update), for example, at least one function of an external electronic device that communicates with the electronic device (for example, a function of turning on/off the external electronic device itself (or some components thereof) or a function of adjusting the brightness (or resolution) of a display), applications executed in the external electronic device, or services (for example, a call service, a message service, etc.) that are provided by the external electronic device.

The applications 370 may include applications (for example, a health care application of a mobile medical appliance, etc.) that are specified according to attributes of external electronic devices. The applications 370 may include applications received from an external electronic device. The applications 370 may include preloaded applications or third-party applications that can be downloaded from a server. The names of the elements of the program module 310, according to the embodiment illustrated in the drawing, may vary depending on the types of operating systems.

At least a part of the program module 310 may be implemented in software, firmware, hardware, or a combination of two or more thereof. At least a part of the program module 310 may be implemented (for example, executed) by, for example, a processor. At least a part of the program module 310 may include, for example, a module, a program, a routine, a set of instructions, a process, or the like for performing one or more functions.

The term "module" as used herein may, for example, mean a unit including one of hardware, software, and firmware or a combination of two or more of them. The "module" may be interchangeably used with, for example, the term "unit", "logic", "logical block", "component", or "circuit". The "module" may be a minimum unit of an integrated component element or a part thereof. The "module" may be a minimum unit for performing one or more functions or a part thereof. The "module" may be mechanically or electronically implemented. For example, the "module" according to the present disclosure may include at least one of an Application-Specific Integrated Circuit (ASIC) chip, a Field-Programmable Gate Arrays (FPGA), and a programmable-logic device for performing operations which are known or are to be developed hereinafter.

At least some of the devices (for example, modules or functions thereof) or the method (for example, operations) according to the present disclosure may be implemented by a command stored in a computer-readable storage medium in a programming module form. The instruction, when executed by a processor (e.g., the processor 120), may cause the one or more processors to execute the function corresponding to the instruction. The computer-readable storage medium may be, for example, the memory 130.

The computer readable storage medium may include a hard disk, a floppy disk, magnetic media (e.g., a magnetic tape), optical media (e.g., a Compact Disc Read Only Memory (CD-ROM) and a Digital Versatile Disc (DVD)), magneto-optical media (e.g., a floptical disk), a hardware device (e.g., a Read Only Memory (ROM), a Random Access Memory (RAM), a flash memory), and the like. In addition, the program instructions may include high class language codes, which can be executed in a computer by using an interpreter, as well as machine codes made by a compiler. The aforementioned hardware device may be configured to operate as one or more software modules in order to perform the operation of the present disclosure, and vice versa.

The programming module according to the present disclosure may include one or more of the aforementioned components or may further include other additional components, or some of the aforementioned components may be omitted. Operations executed by a module, a programming module, or other component elements may be executed sequentially, in parallel, repeatedly, or in a heuristic manner. Further, some operations may be executed according to another order or may be omitted, or other operations may be added. Various embodiments disclosed herein are provided merely to easily describe technical details of the present disclosure and to help the understanding of the present disclosure, and are not intended to limit the scope of the present disclosure. Accordingly, the scope of the present disclosure should be construed as including all modifications or various other embodiments based on the technical idea of the present disclosure.

While the present disclosure has been shown and described with reference to certain embodiments thereof, it will be understood by those skilled in the art that various changes in form and details may be made therein without departing from the spirit and scope of the present disclosure as defined by the appended claims.

What is claimed is:

1. A touch pad for an electronic device, the touch pad comprising:
   a circuit board member; and
   a detection member mounted in at least one area of the circuit board member to detect a user's contact,
   wherein the detection member comprises:
   a plurality of film layers; and
   detection patterns disposed on at least two adjacent film layers, among the plurality of film layers, wherein the detection patterns at least partially overlap each other,
   wherein the detection patterns comprise:
   a first pattern formed on a first layer to constitute a part of the detection patterns; and
   a second pattern formed on a second layer stacked adjacent to the first layer to constitute another part of the detection patterns,
   wherein at least one area of the first pattern and at least one area of the second pattern form an overlapping area where the first and second patterns overlap each other, and at least one other area of the first pattern and at least one other area of the second pattern are spaced apart from each other in a plane direction.

2. The touch pad of claim 1, wherein each film layer has a plurality of conducting wires that are formed by stacking conductive materials, and one of the conducting wires is connected with at least one of the first and second patterns.

3. The touch pad of claim 1, wherein the first and second patterns are electrically connected with each other by coupling generated in the overlapping area.

4. The touch pad of claim 3, wherein the detection patterns have a slit area where the first and second patterns are separated from each other.

5. The touch pad of claim 4, wherein at least one area of the first pattern and at least one area of the second pattern are arranged to form the slit area.

6. The touch pad of claim 5, wherein the first pattern has a ∩-shape, the second pattern has a ∪-shape, and the detection patterns are formed in a C-shape or an O-shape when the first layer having the first pattern formed thereon and the second layer having the second pattern formed thereon are stacked on each other.

7. The touch pad of claim 1, wherein a feeding part of an antenna device is provided on the circuit board member, and the detection member is stacked to overlap an area of the feeding part.

8. The touch pad of claim 1, wherein the film layer further comprises a connecting film electrically connected with the circuit board member.

9. An electronic device comprising:
   a circuit board member disposed in at least one area of a main body of the electronic device;
   a detection member mounted in at least one area of the circuit board member to detect a user's contact; and
   an antenna feeding part that shares a mounting area of the detection member and is mounted in at least one area of the circuit board member,
   wherein the detection member comprises:
   a substrate mounted in the mounting area and having a plurality of films stacked one above another; and
   detection patterns disposed on two adjacently stacked films of the substrate, wherein the detection patterns at least partially overlap each other,
   wherein the detection patterns comprise:
   a first pattern formed on a first film to constitute a part of the detection pattern; and
   a second pattern formed on a second film stacked adjacent to the first film to constitute another part of the detection pattern,
   wherein at least one area of the first pattern and at least one area of the second pattern form an overlapping area where the first and second patterns overlap each other, and at least one other area of the first pattern and at least one other area of the second pattern are spaced apart from each other in a plane direction.

10. The electronic device of claim 9, wherein the first and second patterns are electrically connected with each other by coupling generated in the overlapping area, and an antenna radiation path is formed by the slit area and the separation between the first and second patterns.

* * * * *